(12) United States Patent
Tsao

(10) Patent No.: US 6,551,875 B2
(45) Date of Patent: Apr. 22, 2003

(54) METHOD OF FORMING A UNIFORM COLLAR OXIDE LAYER OVER AN UPPER PORTION OF A SIDEWALL OF A TRENCH EXTENDING INTO A SEMICONDUCTOR SUBSTRATE

(75) Inventor: Li-Wu Tsao, Keelung (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 09/854,407

(22) Filed: May 11, 2001

(65) Prior Publication Data

US 2002/0132423 A1 Sep. 19, 2002

(30) Foreign Application Priority Data

Mar. 16, 2001 (TW) ........................................ 90106222 A

(51) Int. Cl.$^7$ .......................................... H01L 21/8242
(52) U.S. Cl. ...................... 438/246; 438/243; 438/248; 438/386; 438/433
(58) Field of Search ................................ 438/243, 246, 438/248, 386, 238, 586, 433, 435, 439

(56) References Cited

U.S. PATENT DOCUMENTS

| | | | | |
|---|---|---|---|---|
| 4,971,926 A | * | 11/1990 | Kinugawa | ............ 438/382 |
| 5,057,444 A | * | 10/1991 | Fuse et al. | ............ 438/524 |
| 5,183,775 A | * | 2/1993 | Levy | ............ 438/386 |
| 6,008,103 A | * | 12/1999 | Hoepfner | ............ 438/386 |
| 6,127,242 A | * | 10/2000 | Batra et al. | ............ 438/440 |
| 6,200,873 B1 | * | 3/2001 | Schrems et al. | ............ 438/386 |
| 6,238,998 B1 | * | 5/2001 | Leobandung | ............ 438/404 |
| 6,362,040 B1 | * | 3/2002 | Tews et al. | ............ 438/246 |

* cited by examiner

*Primary Examiner*—Amir Zarabian
*Assistant Examiner*—Khanh B. Duong

(57) ABSTRACT

A method of forming a uniform collar oxide layer over an upper portion of a sidewall of a trench extending into a semiconductor substrate is disclosed. A silicon oxide layer and a mask layer are conformally formed on a single-crystal silicon substrate having a trench. A photoresist layer is formed on the mask layer, a part of the photoresist layer is then removed to make the top surface of the photoresist layer lower than the top surface of the single-crystal silicon substrate with a distance. After the mask layer and the silicon oxide layer, which are not covered by the remaining photoresist layer, are removed, the remaining photoresist layer is removed. Then, an ion implantation process is proceeded to make the oxidation rates in the (110) and (100) orientations existing in the sidewall of the trench equal to each other. After the sidewall of the trench is treated, a local oxidation is executed to form a uniform collar oxide layer.

19 Claims, 4 Drawing Sheets

METHOD OF FORMING A UNIFORM COLLAR OXIDE LAYER OVER AN UPPER PORTION OF A SIDEWALL OF A TRENCH EXTENDING INTO A SEMICONDUCTOR SUBSTRATE

BACKGROUND OF THE INVENTION

1. Field of the Invention

The present invention relates in general to a method of manufacturing a deep trench capacitor with or without a vertical transistor thereon. More particularly, the present invention relates to a method for forming a uniform collar oxide layer over an upper portion of a trench sidewall by local oxidation.

2. Description of the Related Art

DRAM is memory capable of reading and writing information. Each DRAM cell needs only one transistor and one capacitor, therefore, it is easy to achieve higher integration to make it broadly applicable to computers and electric equipment. A trench capacitor, which is formed in the semiconductor silicon substrate, is one of the most commonly used capacitors. With the enhancement of the depth of the trench capacitor in the semiconductor silicon substrate, the surface area of the trench capacitor is increased, so that the capacitance is increased.

In order to enhance the density of DRAM cells to increase the total capacitance, the transistor is disposed vertically and the vertical transistor located over the deep trench capacitor replaces the traditional plane-stacked transistor. Before fabricating the trench capacitor, local oxidation is executed as described hereafter. An oxide layer and a nitride layer are conformally deposited over a trench which extends into the semiconductor substrate. A photoresist is formed over the nitride layer, then the photoresist is removed until an upper portion of the trench sidewall having the oxide layer and the nitride layer thereon is exposed. The exposed nitride layer is removed, followed by the oxide layer. The remaining photoresist is then removed. Local oxidation is performed to oxidize the exposed, upper portion trench sidewall and to form a collar oxide layer.

It should be noted that the exposed surface of the trench shows two kinds of crystallographic orientations: (110) orientation and (100) orientation. The oxidation rate varies with orientation, resulting in a disuniform collar oxide layer formed in the trench with unexpected electrical properties. In general, the oxidation rate in (110) is larger then that in (100).

SUMMARY OF THE INVENTION

The present invention provides a method of forming a uniform collar oxide layer over an upper portion of a vertically extending sidewall of a trench extending into a semiconductor substrate. According to one aspect of the invention, the method involves the following steps. A layer of covering material is formed on a substantially vertically extending sidewall of a trench which extends into a semiconductor substrate. The layer of covering material is partially removed over only a portion of the sidewall to expose an upper region. The surface of the exposed region is treated to make the (110) and (100) orientations have the same oxidation rates by ion implantation. A uniform collar oxide layer grows over the exposed portion by local oxidation of the upper region.

According to another aspect of the invention, a method is provided for forming a uniform collar oxide layer over an upper portion of a trench sidewall with (110) and (100) orientations. This alternate method involves the following steps. A conformal mask layer is deposited on a substantially vertically extending sidewall of a trench. The trench is filled with a resist material, and the resist material is etched a predetermined depth from the upper surface of the substrate to the upper surface of the remaining resist, thereby removing a portion of the mask layer from an upper portion of the sidewall in order to space the substrate a set distance from an upper surface of the substrate. Ion implantation is conducted to treat the (110) and (100) orientations existing on the trench sidewall to have the same oxidation rates. A uniform collar oxide layer is formed over the exposed portion by local oxidation of the upper region.

In accordance with the present invention, the dopant used in the ion implantation process can be an oxidation-suppressed dopant or an oxidation-enhanced dopant. In the former case, the dopant can be nitrogen ($N_2$), neon (Ne), argon (Ar), xenon (Xe) or others. In the latter case, the dopant can be oxygen or another. The tilt angle $\theta$ of the wafer used in the ion implantation process depends on the width (w) of the trench and the depth (d) of the exposed trench sidewall, and is $(\tan^{-1}w/d)\pm 0.5°$, preferably between about 7° and about 45°. The ion implanting energy is below 200 keV. The dosage used is between $1\times 10^{12}$ and $5\times 10^{16}$.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

A method of forming a uniform collar oxide layer over an upper portion of a vertically extending sidewall of a trench extending into a semiconductor substrate is disclosed in the following steps. A layer of covering material is formed on a substantially vertically extending sidewall of a trench which extends into a semiconductor substrate. The preferred layer of covering material is a nitride layer, with the optimum being a stacked layer of oxide layer/nitride layers. The layer of covering material is partially removed over only an upper portion of the sidewall to expose an upper region. The method of partially removing the layer of covering material is, for example, filling the trench with a resist material, and etching the resist material a predetermined depth "d" from the upper surface of the substrate to the upper surface of the remaining resist, thereby removing a portion of the layer of covering material from an upper portion of the sidewall in order to space the substrate a selected distance "d" from a upper surface of the substrate. Then the surface of the exposed trench sidewall is treated to make the (110) and (100) orientations existing on the trench sidewall have the same oxidation rates by an ion implantation with a predetermined tilt angle "θ" toward (110) or (100) face, alternatively. A uniform collar oxide layer grows over the exposed portion by local oxidation of the upper region.

With regards to the ion implantation, the dopant used in the ion implantation process can be an oxidation-suppressed dopant, such as nitrogen ($N_2$), neon (Ne), argon (Ar), xenon (Xe), and others, or an oxidation-enhanced dopant, such as oxygen and others. The ion implantation is conducted under the following conditions. The tilt angle θ of the wafer depends on the width "w" of the trench and the depth "d" of the exposed trench sidewall, and is ($tan^{-1}w/d$)±0.5°, preferably about 7°~45°. The ion implanting energy is below 200 keV. The dosage is between approximately $1\times10^{12}$ and $5\times10^{16}$.

Embodiment

FIG. 1A to FIG. 1E show serial sectional views of formation of a uniform collar oxide layer over an upper portion of a sidewall of a trench extending into a semiconductor substrate and forming a deep trench capacitor according to the embodiment of the present invention.

Figure 1B:
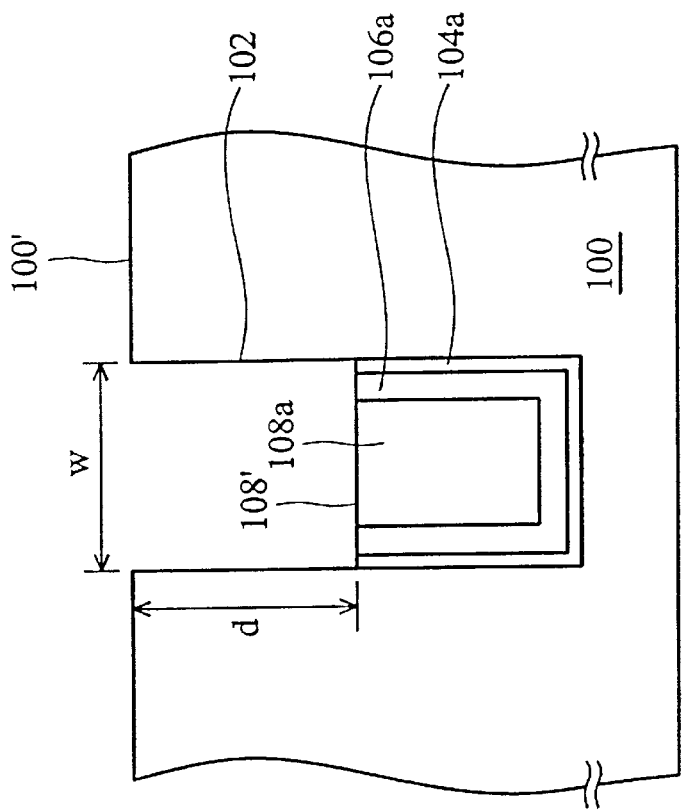
FIG. 1A to FIG. 1E depict the method of forming a uniform collar oxide layer over an upper portion of a sidewall of a trench extending into a semiconductor substrate and forming a deep trench capacitor according to the embodiment of the present invention.
Figure 1A:
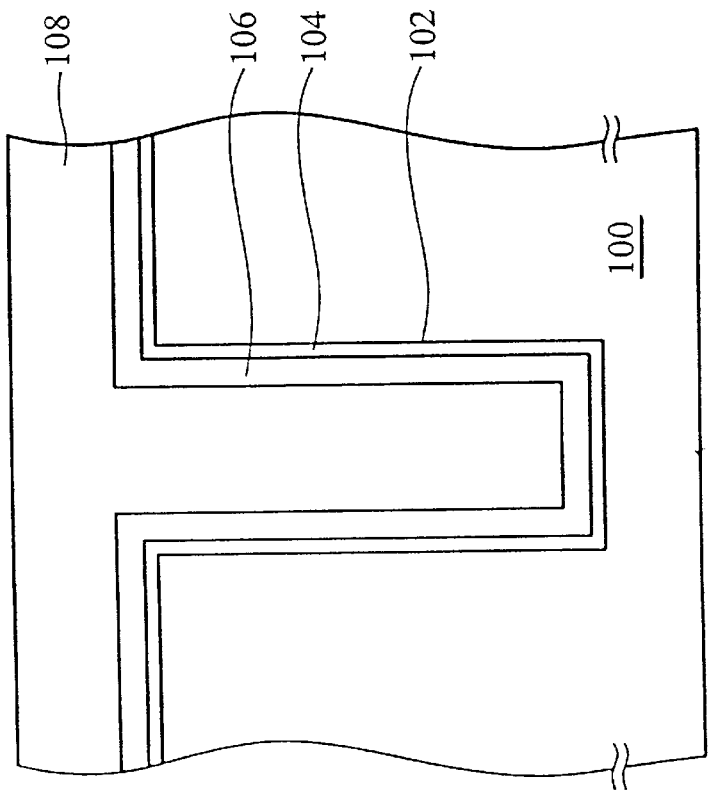

Referring to FIG. 1A, a substrate (also called a wafer) 100, such as a single-crystal silicon substrate, is provided. A deep trench (referred to as trench hereafter) 102 is formed in the substrate 100 by, for example, etching. A conformal oxide layer 104, such as a silicon oxide layer, and a conformal mask layer 106, such as a silicon nitride layer, are formed over the trench which extends into the substrate 100. A photoresist 108 is formed on the mask layer 106.

With reference to FIG. 1B, the photoresist 108 is partially removed and converted to the remaining photoresist 108a by, for example, wet etching or dry etching. Therefore, the top surface 108' of the photoresist 108a is lower than the top surface 100' of the substrate 100 by a set distance "d", which is substantially equal to the length of the to-be-formed collar oxide layer. The exposed mask layer 106 is removed by wet etching, employing the photoresist 108a as a mask, and the exposed oxide layer 104 is then also removed by wet etching, so as to convert them to the mask layer 106a and the oxide layer 104a, respectively. This results in the exposure of the upper portion of the trench sidewall of the substrate 100. The photoresist 108a is then removed, as shown in FIG. 1C.

Figure 1D:
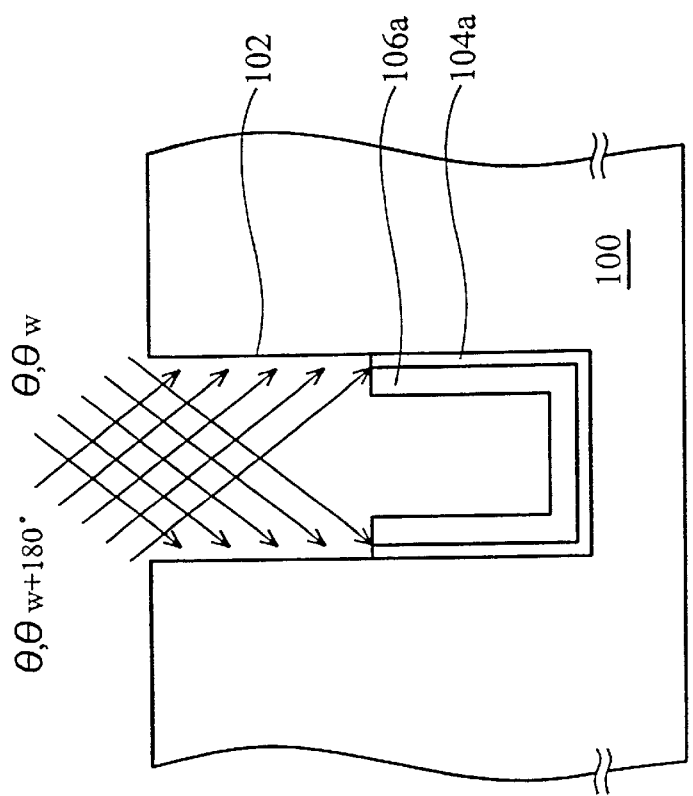
Figure 1C:
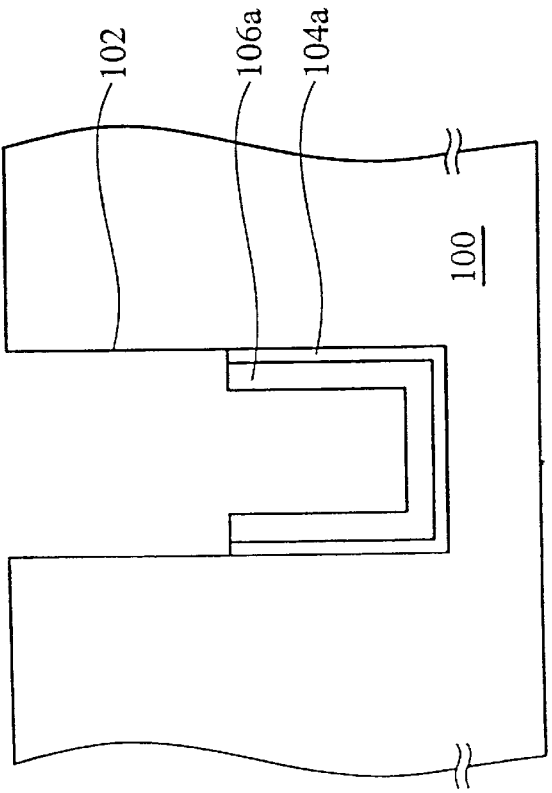

Turning to FIG. 1D, after removing the photoresist 108a, a dopant is introduced into the exposed sidewall of the trench 102 to treat the (110) and (100) orientations existing on the sidewall of trench 102 creating the same oxidation rates by an ion implantation.

With regards to the ion implantation, the dopant used in the ion implantation process can be an oxidation-suppressed dopant, such as nitrogen ($N_2$), neon (Ne), argon (Ar), xenon (Xe), or others, or an oxidation-enhanced dopant, such as oxygen or others. The tilt angle θ of the wafer used in the ion implantation depends on the width "w" of the trench and the depth "d" of the exposed trench sidewall, and is ($tan^{-1}w/d$) ±0.5°. The preferred tilt angle θ is approximately 7~45°. The ion implanting energy used in the ion implantation is below 200 keV. The dosage used in the ion implantation is within the range from $1\times10^{12}$ to $5\times10^{16}$.

According to the property of the selected dopant, two methods of implanting steps can be chosen. One way is to implant the oxidation-suppressed dopant toward the (110) face to reduce the oxidation rate on (110) orientation, so as to get the same oxidation rates on (110) and (100) orientations. In this case, the twist angles $θ_ω$ and $θ_ω+180°$ used in the ion implantation are defined in (110) face. Another is to implant the oxidation-enhanced dopant toward the (100) face to increase the oxidation rate on (100) orientation, so as to get the same oxidation rates on (110) and (100) orientations. In this case, the twist angles $θ_ω$ and $θ_ω 180°$ used in the ion implantation are defined in (100) face.

Figure 2:
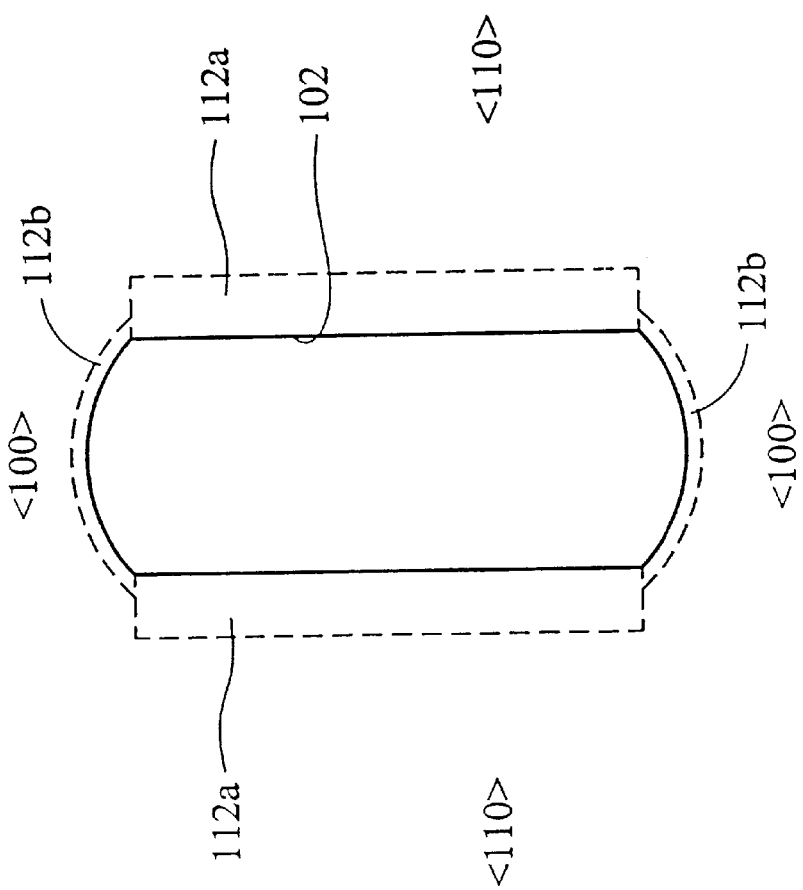
FIG. 2 is a top view of FIG. 1D.

In the above-mentioned, former case, the distribution of the dopants is shown in FIG. 2. Although the ion implantation aims at (110) face resulting in doped region 112a, few dopants have the chance to partially implant on (100) face resulting in doped region 112b. However, the range and concentration of the doped region 112b is far smaller than that of the main doped region 112a.

Figure 1E:
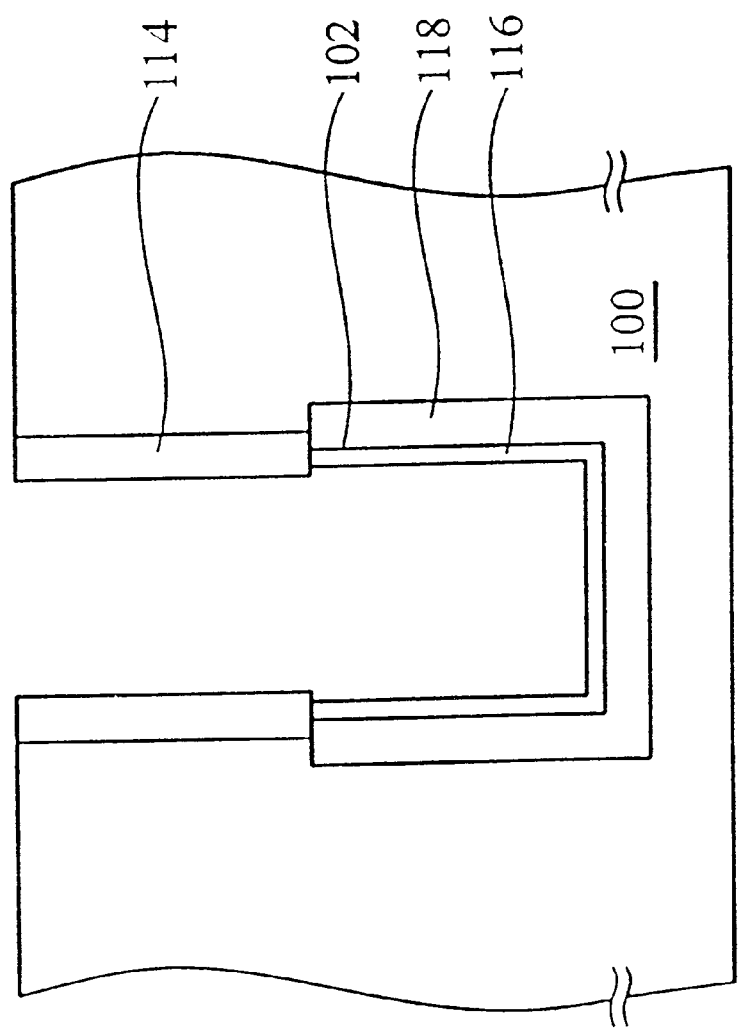

As shown in FIG. 1E, a collar oxide layer 114 is formed on the upper portion of the sidewall of the trench 102 to act as a vertically isolating layer. The formed collar oxide layer 114 has uniform thickness and stable isolation property. If the method of the present invention is applied to fabricate a trench capacitor with a vertical transistor thereon, the vertical transistor can get stable electrical properties.

The remaining mask layer 106a and the remaining oxide layer 104a are stripped to expose the lower portion of the trench 102, and the subsequent trench capacitor process is proceeded. A buried plate (BP) is formed in the substrate 100 along the lower portion of the trench 102 to act as a lower electrode 118. A dielectric layer 116, such as oxynitride layer/oxide layer, is formed on the lower electrode.

The standard steps are conducted to finish the capacitor. However, these parts are not concerned with the present invention, and are thus omitted.

According to the above-mentioned description, the present invention has at least the following advantages.

a. Before the local oxidation is executed, the surface of the trench sidewall is treated to make the oxidation rates on (110) face and (100) face similar. Therefore, a uniform collar oxide layer is formed by local oxidation.

b. The oxidation-suppressed dopant is implanted toward the (110) face existing in the trench to reduce the oxidation rate on (110) orientation, so as to get the same oxidation rates on (110) and (100) orientations. Therefore, a uniform collar oxide layer is formed by local oxidation.

c. The oxidation-enhanced dopant is implanted toward the (100) face existing in the trench to increase the oxidation rate on (100) orientation, so as to get the same oxidation rates on (110) and (100) orientations. Therefore, a uniform collar oxide layer is formed by local oxidation.

d. The method of forming a uniform collar oxide layer over an upper portion of a vertically extending sidewall of a trench extending into a semiconductor substrate can be applied to fabricate a trench capacitor or that with a vertical transistor thereon. The reliability of the products is thus improved.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of forming a uniform collar oxide layer over an upper portion of a sidewall of a trench extending into a semiconductor substrate, comprising:

providing a semiconductor substrate;

forming a trench extending into the semiconductor substrate with a width of w;

forming a conformal oxide layer and a conformal mask layer;

forming a photoresist layer on the mask layer;

removing a part of the photoresist layer to make the top surface of the photoresist layer lower than the top surface of the semiconductor substrate with a distance d;

removing the mask layer and the oxide layer to expose an upper portion of the sidewall of the trench;

removing the photoresist layer;

performing an ion implantation process to reduce oxidation rate on (110) orientation with a dopant to make the oxidation rates on (110) and (100) orientations existing in the sidewall of the trench equal to each other; and performing local oxidation to form a collar oxide layer with a uniform thickness on the upper portion of the sidewall of the trench.

2. The method as claimed in claim 1, wherein the dopant used in the ion implantation process is an oxidant-suppressed dopant.

3. The method as claimed in claim 2, wherein the oxidation-suppressed dopant is selected from the group consisting of nitrogen, argon, neon and xenon.

4. The method as claimed in claim 1, wherein the ion implantation process is further performed with an oxidation-enhanced dopant to increase oxidation rate on (100) orientation.

5. The method as claimed in claim 4, wherein the oxidation-enhanced dopant is oxygen.

6. The method as claimed in claim 1, wherein a tilt angle used in the ion implantation process is $(\tan^{-1}w/d)\pm5°$.

7. The method as claimed in claim 6, wherein the tilt angle is from 7° to 45°.

8. The method as claimed in claim 1, wherein an ion implanting energy used in the ion implantation process is below 200 keV.

9. The method as claimed in claim 1, wherein a dosage used in the ion implantation process is between $1\times10^{12}$ and $5\times10^{16}$.

10. A method of fabricating a deep trench capacitor, comprising:

providing a single-crystal silicon substrate;

forming a trench in the single-crystal silicon substrate with a width of w;

forming a conformal oxide layer and a conformal mask layer;

forming a photoresist layer on the mask layer;

removing a part of the photoresist layer to make the top surface of the photoresist layer lower than the top surface of the single-crystal silicon substrate with a distance d;

removing the mask layer and the oxide layer to expose an upper portion of the sidewall of the trench;

removing the photoresist layer;

performing an ion implantation process to reduce oxidation rate on (110) orientation with a dopant to make the oxidation rates on (110) and (100) orientations existing in the sidewall of the trench equal to each other;

performing a local oxidation to form a collar oxide layer with a uniform thickness on the upper portion of the sidewall of the trench;

removing the mask layer and the oxide layer until the surface of the single-crystal silicon substrate is exposed;

forming a lower electrode in the trench in the single-crystal silicon substrate; and forming a dielectric layer on the lower electrode.

11. The method as claimed in claim 10, wherein the dopant used in the ion implantation process is an oxidation-suppressed dopant.

12. The method as claimed in claim 11, wherein the oxidation-suppressed dopant is selected from the group consisting of nitrogen, argon, neon and xenon.

13. The method as claimed in claim 10, wherein the ion implantation process is further performed with an oxidation-enhanced dopant to increase oxidation rate on (100) orientation.

14. The method as claimed in claim 13, wherein the oxidation-enhanced dopant is oxygen.

15. The method as claimed in claim 10, wherein a tilt angle used in the ion implantation process is $(\tan^{-1}w/d)\pm5°$.

16. The method as claimed in claim 15, wherein the tilt angle is between 7° and 45°.

17. The method as claimed in claim 10, wherein the ion implanting energy used in the ion implantation process is below 200 keV.

18. The method as claimed in claim 10, wherein a dosage used in the ion implantation process is between $1\times10^{12}$ and $5\times10^{16}$.

19. The method as claimed in claim 10, wherein the dielectric layer is silicon oxynitride layer/silicon oxide layer.

* * * * *